US010120969B1

(12) United States Patent
Sinclair et al.

(10) Patent No.: US 10,120,969 B1
(45) Date of Patent: Nov. 6, 2018

(54) GLOBAL VARIABLE OPTIMIZATION FOR INTEGRATED CIRCUIT APPLICATIONS

(71) Applicant: ALTERA CORPORATION, San Jose, CA (US)

(72) Inventors: Byron Sinclair, Toronto (CA); Andrew Chaang Ling, Toronto (CA); John Stuart Freeman, Waterloo (CA)

(73) Assignee: Altera Corporation, San Jose, CA (US)

( * ) Notice: Subject to any disclaimer, the term of this patent is extended or adjusted under 35 U.S.C. 154(b) by 163 days.

(21) Appl. No.: 15/199,538

(22) Filed: Jun. 30, 2016

(51) Int. Cl.
*G06F 17/50* (2006.01)
(52) U.S. Cl.
CPC ...... *G06F 17/5054* (2013.01); *G06F 17/5009* (2013.01)
(58) Field of Classification Search
CPC .......................... G06F 17/5054; G06F 17/5009
USPC ....................................................... 716/116
See application file for complete search history.

(56) References Cited

U.S. PATENT DOCUMENTS

2012/0324408 A1* 12/2012 Shacham ............ G06F 17/5045
716/102
2015/0295579 A1* 10/2015 How .................. H03K 19/1774
326/93

* cited by examiner

*Primary Examiner* — Suchin Parihar
(74) *Attorney, Agent, or Firm* — Fletcher Yoder, P.C.

(57) ABSTRACT

Systems and methods for generating and deploying integrated circuit (IC) applications are provided. Global variable implementation logic may be used to optimize implementation, on an integrated circuit, of functionality represented by high-level code including global variables. A compiler's intermediate representation is analyzed for one or more characteristics that may be used to determine one or more initialization parameters, one or more scope parameters, one or more implementation parameters, or any combination thereof of the functionality. An HDL is generated based upon the one or more initialization parameters, the one or more scope parameters, the one or more implementation parameters, or the any combination thereof.

20 Claims, 5 Drawing Sheets

GLOBAL VARIABLE OPTIMIZATION FOR INTEGRATED CIRCUIT APPLICATIONS

BACKGROUND

The present disclosure relates generally to integrated circuits, such as field programmable gate arrays (FPGAs). More particularly, the present disclosure relates to memory allocation for variables of applications designed for integrated circuits (e.g., FPGAs).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Integrated circuits (ICs) take a variety of forms. For instance, field programmable gate arrays (FPGAs) are integrated circuits that are intended as relatively general-purpose devices. FPGAs may include logic that may be programmed (e.g., configured) after manufacturing to provide any desired functionality that the FPGA is designed to support. Thus, FPGAs contain programmable logic, or logic blocks, that may be configured to perform a variety of functions on the FPGAs, according to a designer's design. Additionally, FPGAs may include input/output (I/O) logic, as well as high-speed communication circuitry. For instance, the high-speed communication circuitry may support various communication protocols and may include high-speed transceiver channels through which the FPGA may transmit serial data to and/or receive serial data from circuitry that is external to the FPGA.

In ICs such as FPGAs, when generating hardware on the ICs via code (e.g., computer code written in the C language), it may be unclear how global variables of the code should be initialized as hardware, as global variables may be accessed by any number of functions of a file or program and, thus, no single function "owns" the memory associated with the global variables. Allowing all components to retain access to global variables, as hardware is generated on the ICs, may lead to inefficient hardware utilization within the ICs, resulting in reduced capabilities and/or reduced performance, for example.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to systems, methods, and devices for automatically implementing global variables of an application in hardware of the ICs, without guidance. In particular, the present embodiments relate to automatically identifying and optimizing initialization, concurrency, and an implementation for hardware associated with global variables of applications of ICs, during hardware generation on the ICs, via computer processing circuitry and/or machine-readable instructions.

Various refinements of the features noted above may be employed in relation to various aspects of the present disclosure. Further features may also be incorporated in these various aspects as well. These refinements and additional features may be employed individually or in any combination. For instance, various features discussed below in relation to one or more of the illustrated embodiments may be incorporated into any of the above-described aspects of the present invention alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in further detail below, embodiments of the present disclosure relate generally to circuitry and/or machine-readable instructions stored on a tangible, non-transitory, machine-readable medium for enabling optimized hardware generation on an integrated circuit (IC). In particular, code (e.g., C programming language code) may use global variables that result in hardware generated on an IC. In the current embodiments, a compiler analyzes the global variables to determine a preferred initialization mechanism, scope, and architecture for hardware resulting from these global variables.

Figure 1:
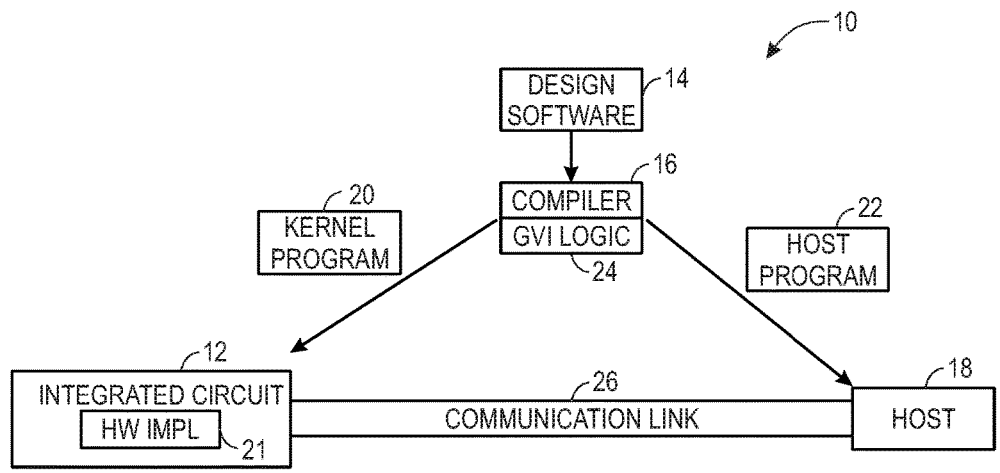
FIG. 1 is a block diagram of a system that utilizes global variable implementation logic to execute an IC-implemented program, in accordance with an embodiment.

With the foregoing in mind, FIG. 1 illustrates a block diagram of a system 10 that utilizes global variable implementation logic to affect a machine-implemented hardware generation for an IC 12. As discussed above, a designer may desire to implement functionality on an integrated circuit 12 (IC, such as a field programmable gate array (FPGA)). The designer may specify a program to be implemented, in a high-level programming language, which may enable the designer to more efficiently and easily provide programming instructions to implement a set of programmable logic for the IC 12 without requiring specific knowledge of low level computer programming languages (e.g., Verilog or VHDL). For example, because designers are familiar with high level programming languages, such as C++, designers of programmable logic familiar with such programming languages may have a reduced learning curve in comparison to complex low-level design languages.

The designers may implement their high level designs using design software 14, such as a version of Quartus by Altera™. The design software 14 may use a compiler 16 to convert the high level program into a low level program. The compiler 16 may provide machine-readable instructions representative of the high level program to a host 18 and the IC 12. For example, the IC 12 may receive one or more kernel programs 20 which describe the hardware implementations 21 that should be stored in the IC. The host 18 may receive a host program 22 which may be implemented by the kernel programs 20.

Because the compiler 16 is aware of an intermediate representation of the high-level program, the compiler 16 (or other component associated with the compiler) is able to analyze the high-level program for certain characteristics, which may be useful in dynamically determining certain parameter optimizations for hardware generation. For example, the compiler 16 may be equipped with global variable implementation logic 24, which may analyze received high-level code to determine certain characteristics of the global variables in the high-level code. These characteristics of the global variables and/or high-level program may be used by the global variable implementation logic 24 to automatically determine certain hardware implementation features of the kernel program 20. For example, as will be discussed in more detail below regarding FIG. 4, initialization options regarding when and/or how to load initial values to certain generated hardware may be determined based on analysis of whether the functionality described by the high-level code relies on initialized values and/or whether initialization occurs on reset. Additionally and/or alternatively, as will be discussed in more detail regarding FIG. 5, the global variable implementation logic 24 may determine an "owner" or managing component of memory associated with the global variable functionality, based upon characteristics of the data to be stored, such as whether the data is accessed outside the generated hardware and/or a size of the data. Further, in some embodiments, as will be discussed in more detail regarding FIG. 6, the global variable implementation logic 24 may additionally and/or alternatively determine an architecture for implementation of the generated hardware, based upon characteristics, such as an amount of storage that is used for the hardware functionality, specific data access patterns that are observed, etc.

To implement the host program 22, the host 18 may communicate instructions from the host program 22 to the IC 12 via a communication link 26. The communication link 26 may be, for example, direct memory access (DMA) communications or peripheral component interconnect express (PCIe) communications. As mentioned above, implementation of the host program 22 may be facilitated by hardware generated according to the kernel program 20. Further, the hardware may be optimized by the global variable implementation logic 24, resulting in faster and more efficient execution of the host program 22 on the IC 12.

Figure 2:
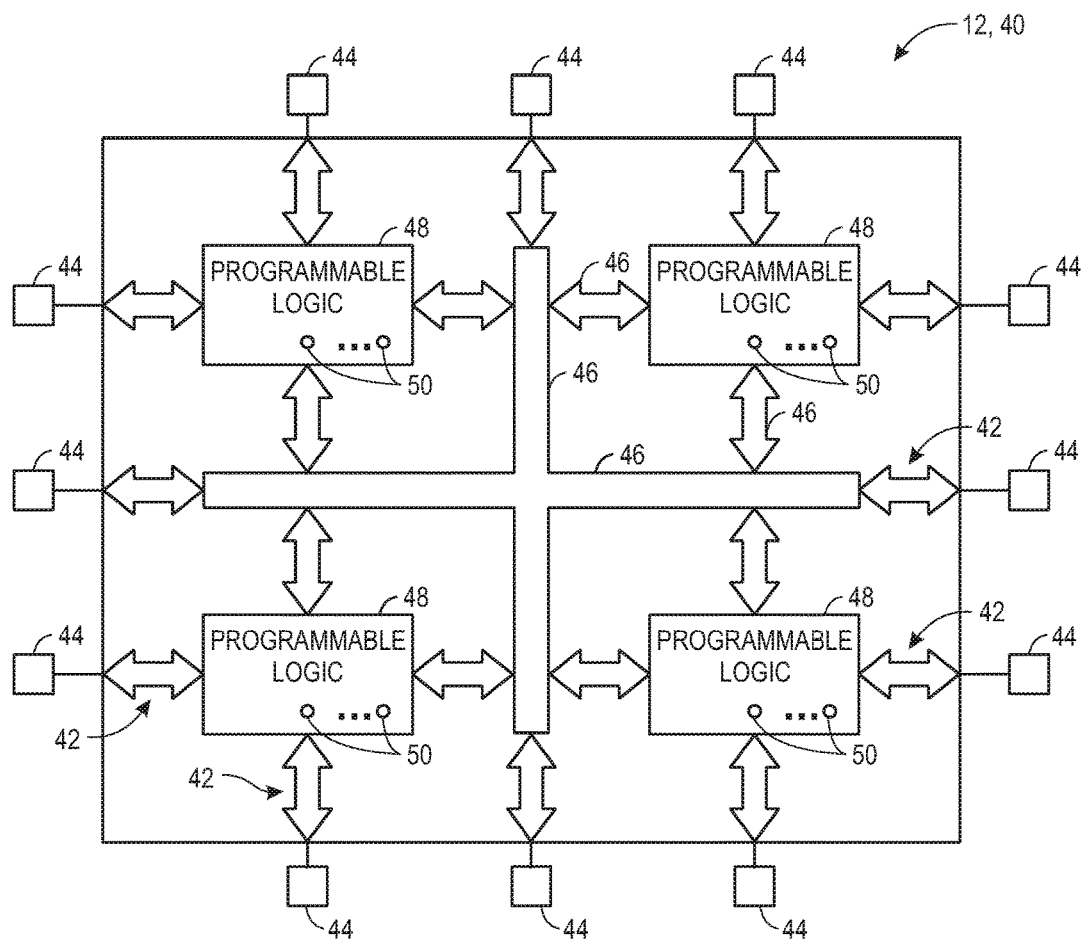
FIG. 2 is a block diagram of a programmable logic device where hardware may be implemented using the global variable implementation logic of FIG. 1, in accordance with an embodiment.

Turning now to a more detailed discussion of the IC 12, FIG. 2 illustrates an IC device 12, which may be a programmable logic device 40, such as a field programmable gate array (FPGA). For the purposes of this example, the device 40 is referred to as an FPGA, though it should be understood that the device may be any type of programmable logic device. As shown, FPGA 40 may have input/output circuitry 42 for driving signals off of device 40 and for receiving signals from other devices via input/output pins 44. Interconnection resources 46, such as global and local vertical and horizontal conductive lines and buses, may be used to route signals on device 40. Additionally, interconnection resources 46 may include fixed interconnects (conductive lines) and programmable interconnects (i.e., programmable connections between respective fixed interconnects or logic elements). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48. The FPGA 40 may include adaptable logic that enables partial reconfiguration of the FPGA 40, such that kernels may be added, removed, and/or swapped during the runtime of the FPGA 40.

Programmable logic devices (PLDs), such as FPGA 40, may contain programmable elements 50 with the programmable logic 48. For example, as discussed above, a designer (e.g., a customer) may program (e.g., configure) the programmable logic 48 to perform one or more desired functions. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth.

As discussed above, the FPGA 40 may allow a designer to create a customized design capable of executing and performing customized functionalities. Each design may have its own hardware implementation to be implemented on the FPGA 40. For instance, a single hardware implementation is needed for each kernel in a design for the FPGA 40. In some instances, it may be desirable to enable the compiler 16 of FIG. 1 to generate the hardware implementation on the FPGA 40 based upon certain features detected by the compiler 16. For example, as discussed in more detail herein, hardware functionality that is represented in the high-level code using global variables may be particularly implemented based upon features of the global variables and/or high-level program. Optimization of such hardware generation is described in more detail below.

Figure 3:
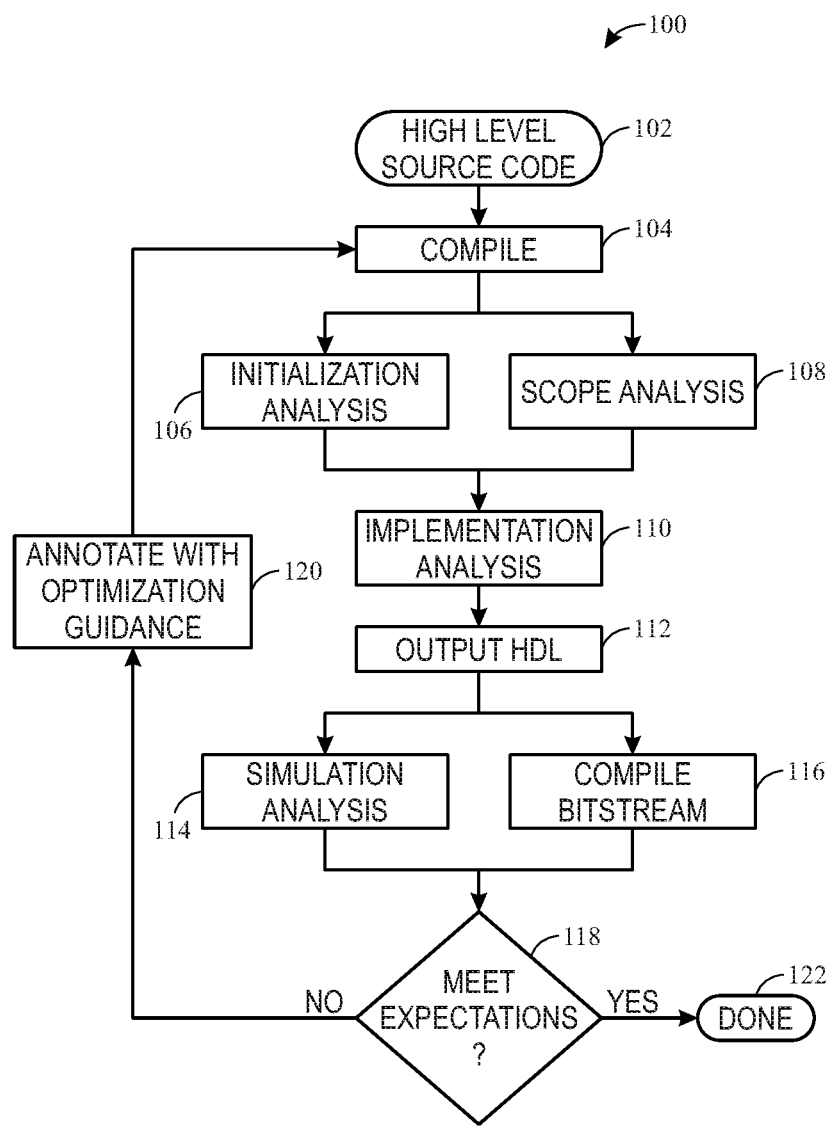
FIG. 3 is a flow chart illustrating a process for implementing hardware based upon global variable characteristics, in accordance with an embodiment.

Turning now to a mode detailed discussion of optimizations for global variable based hardware, FIG. 3 is a flow chart illustrating a process 100 for implementing hardware based upon global variable characteristics, in accordance with an embodiment. As mentioned above, a designer may implement high-level source code 102 (e.g., via the design software 14 of FIG. 1). The high-level source code 102 may describe functionality to be implemented by the IC 12.

The compiler 16 may compile an intermediate representation (IR) of the high level source code 102 (block 104). The IR may be a data structure or code that is used internally by the compiler to represent the high level source code 102. As will be discussed in more detail below, analysis of the IR may be useful in discerning implementation parameters of hardware generated based upon global variables of the high level source code 102.

For example, the IR may be analyzed to determine initialization parameters for the generated hardware (block 106). The initialization parameters indicate whether or not to provide initial data values to the generated hardware and whether the provided initial data values should be provided upon start-up and/or upon reset.

The IR may also be analyzed to determine a scope of the generated hardware (block 108). During this analysis, the compiler 16 may determine a particular component that will "own" or manage the memory associated with the generated hardware. For example, in one embodiment, the memory may be managed internally by a Register Transfer Level (RTL) module. In other embodiments, the memory may be managed externally. In either embodiment, the proper memory mapped interfaces may be generated to accommodate access to the memory.

In the current embodiment, the initialization analysis (block 106) and the scope analysis (block 108) are shown as parallel processing. Indeed, the initialization analysis (block 106) and the scope analysis (block 108) are independent and may not rely on one another for optimization. However, in alternative embodiments, the initialization analysis (block 106) and the scope analysis (block 108) may be serially processed.

The IR may also be analyzed to determine an optimized architecture for the generated hardware (block 110). During the implementation analysis, a particular optimized structure is selected for implementation of the generated hardware. For example, an implementation option, such as register implementation, shift register implementation, FIFO implementation, etc., may be selected based upon a usage inference in the IR and a set of hardware resources that are available.

Based upon optimizations of the initialization analysis (block 106), the scope analysis (block 108), and/or the implementation analysis (block 110), a hardware description language (HDL) may be generated and outputted (block 112). The HDL is a specialized computer language that describes the structure and behavior to be implemented by the IC 12 of FIG. 1.

Synthesis of the outputted HDL may result in implementation of the generated hardware on the IC 12 and/or simulation. For example, a bitstream may be compiled (block 116), which describes logic gate settings to implement the generated hardware.

Further, a simulation of the implemented hardware may be performed and analyzed (block 114) to determine if operational expectations are met (decision block 118). For example, a designer may indicate (e.g., in the design software 14) particular goals, such as operating efficiencies, etc., for the implementation. When these goals are not met during the simulation, annotations that provide further optimization guidance may be provided to the compiler 16 (block 120), which may result in a subsequent compile (block 104) with modifications based upon the annotations of block 120). However, when the expectations are met, the process 100 finishes 122 with a sufficiently optimized hardware generation result.

Figure 4:
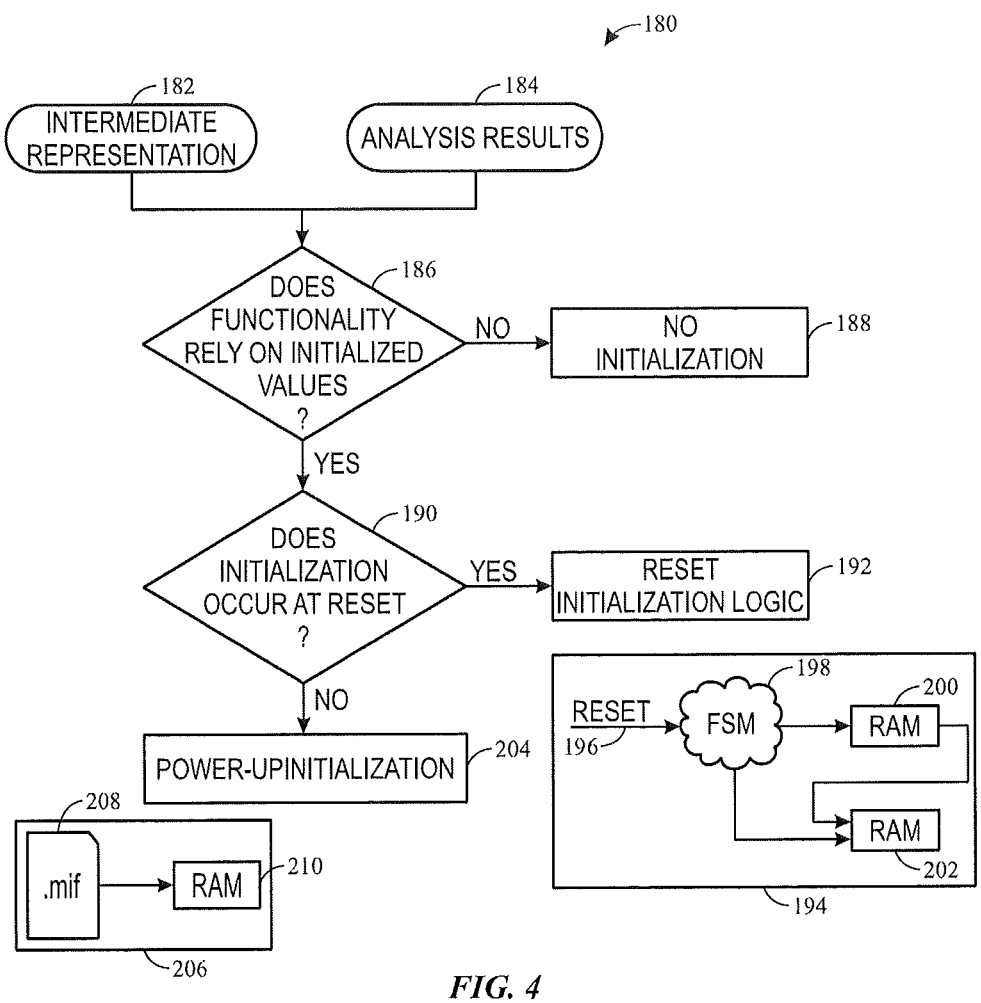
FIG. 4 is a flow chart illustrating a process for determining a hardware initialization mechanism for the hardware implemented on the IC, in accordance with an embodiment.

FIG. 4 is a flow chart illustrating a process 180 for determining a hardware initialization mechanism for the hardware implemented on the IC 12 of FIG. 1, in accordance with an embodiment. The process 180 may be one embodiment of the initialization analysis depicted in block 106 of FIG. 3.

As mentioned above, the initialization analysis of process 180 may determine whether initial values are to be provided and when. This determination may be made by analyzing the intermediate representation (IR) 182 of the compiler 16 and/or analysis results 184 (e.g., of the simulation analysis (block 114 of FIG. 3), in the form of annotations of block 120 of FIG. 3). Analyzing the IR 182 and/or the analysis results 184, a determination is made as to whether the functionality relies on initialized values (decision block 186). If the functionality does not rely on initialized values, the no initialization will be implemented in the HDL (block 188).

However, when the functionality does rely on initialized values, a subsequent determination is made as to whether initialization occurs at reset (decision block 190). When initialization occurs at reset, reset initialization logic may be implemented in the HDL (block 192). For example, logic 194 provides one embodiment of reset initialization logic. In the logic 194, a reset signal 196 triggers duplication of memory via a Finite State Machine 198. For example, random-access-memory (RAM) 200 may be used to load initial values to RAM 202 upon assertion of the reset signal 196. This results in initial values of RAM 200 propagating to RAM 202 upon reset.

When initialization does not occur at reset (e.g., initialization occurs at power-up), power up initialization may be implemented (block 204). For example, as illustrated in box 206, a memory information file ".mif file" 208 may be used to indicate initial values (e.g., for the RAM 200). The .mif file 210 may be any suitable representation that specifies initial content of a memory block (e.g., CAM, RAM, or ROB), that is, initial values for each address. For example, the memory information file 208 may be a text file (e.g., an ASCII or Unicode text file) or a markup file (e.g., XML or HTML). The .mif file 210 may be provided as an input file to the compiler 16, which may update the HDL accordingly.

Figure 5:
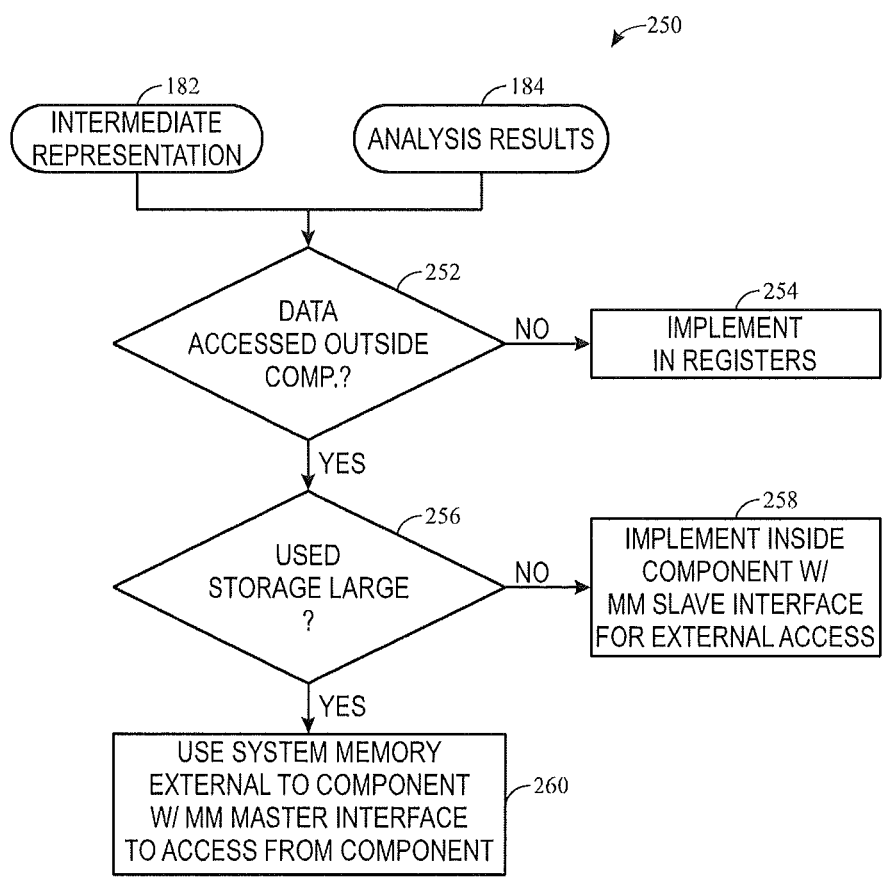
FIG. 5 is a flow chart illustrating a process for determining a scope for the hardware implemented on the IC, in accordance with an embodiment.

Turning now to a discussion of scope determination, FIG. 5 is a flow chart illustrating a process 250 for determining a scope for the hardware implemented on the IC 12 of FIG. 1, in accordance with an embodiment. The process 250 may be one embodiment of the scope analysis depicted in block 108 of FIG. 3.

As mentioned above, the scope analysis of process 180 may determine which components should "own" or manage the memory of the generated hardware. This determination may be made by analyzing the intermediate representation (IR) 182 of compiler 16 and/or analysis results 184 (e.g., of the simulation analysis (block 114 of FIG. 3), in the form of annotations of block 120 of FIG. 3).

For example, by analyzing the IR 182 and/or the intermediate representation 182, a determination is made as to whether data is accessed outside of the generated hardware (decision block 252). If the data is not accessed externally, the data is implemented in registers (block 254). However, when the data is accessed externally, a subsequent determination is made as to whether the amount of storage that is used is large (e.g., exceeds a pre-programmed threshold value) (decision block 256). If the amount of storage used is not large (e.g., does not exceed the pre-programmed threshold value), the memory is implemented inside the generated hardware component with a memory management slave interface for external access of the data (block 258). However, when the amount of storage used is large (e.g., exceeds a pre-programmed threshold value), external system memory is used with a memory manager master interface to access from the generated hardware component (block 260).

Figure 6:
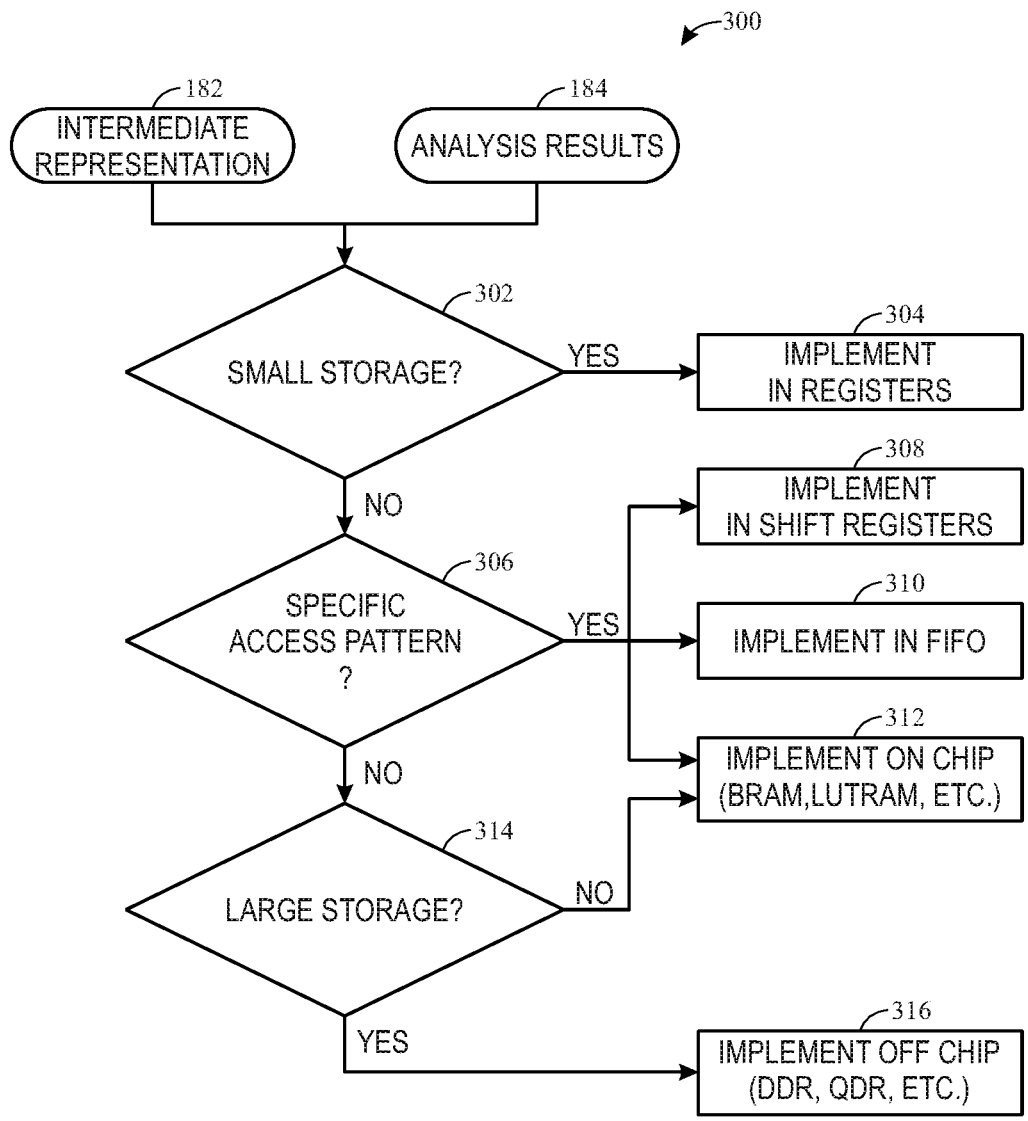
FIG. 6 is a flow chart illustrating determination of an architecture for the hardware implemented on the IC, in accordance with an embodiment.

Turning now to a discussion on architecture determination, FIG. 6 is a flow chart illustrating a process 300 for determination of an architecture for the hardware implemented on the IC 12 of FIG. 1, in accordance with an embodiment. The process 300 may be one embodiment of the implementation analysis depicted in block 110 of FIG. 3.

As mentioned above, the implementation analysis of process 300 may determine which architectures should be implemented for the memory of the generated hardware. This determination may be made by analyzing the intermediate representation (IR) 182 of compiler 16 and/or analysis results 184 (e.g., of the simulation analysis (block 114 of FIG. 3), in the form of annotations of block 120 of FIG. 3).

For example, by analyzing the IR 182 and/or the analysis results 184, a determination may be made as to whether the storage used for the implementation is small (decision block 302). If the storage is small (e.g., less than a pre-determined threshold value), the hardware may be implemented in registers (block 304). Otherwise, when the storage is not small (e.g., greater than a pre-determined threshold value), a subsequent determination is made.

In the subsequent determination, a determination is made as to whether a particular data access pattern can be observed (decision block 306). For example, when an access pattern is observed, the access pattern may affect a selected architecture for the hardware implementation. For example, when a series of variables are used and data access to the variables is frequently shifted left and/or right, a shift register may be implemented (block 308). When the data access patterns indicates shifting in one side and out the other of a series of variables, a first in first out (FIFO) buffer may be used (block 310). If neither of these patterns is observed, but an alternative pattern is observed, an on-chip solution, such as Buffer Random Access Memory (BRAM), distributed memory (LUTRAM), etc., may act as a fallback selection (block 312).

If no specific pattern is detected, a subsequent determination is made as to whether the storage used is large (decision block 314). If the storage is not large (e.g., is less than a pre-determined threshold value), the on chip solution (e.g., BRAM, LUTRAM, etc.) may be used (block 312). However, when the storage is large (e.g., greater than a pre-determined threshold value), an off-chip solution may be selected (e.g., Double Data Rate (DDR) SD RAM, Quad Data Rate (QDR) SRAM, etc.) (block 316).

By implementing logic that optimizes hardware generation for global variable based functionality, operational efficiencies may be observed. For example, proper data initialization and scope may be ensured, while a sufficient/proper hardware architecture is derived. This may result in increased implementation efficiencies, resulting in a better user experience.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A tangible, non-transitory, computer-readable medium, comprising instructions to:
   receive a high-level program comprising code indicative of functionality to be implemented on an integrated circuit (IC), wherein the code comprises one or more global variables of the high-level program;
   compile the code into an intermediate representation comprising a data structure, intermediate code, or both that is used internally by a compiler to represent high-level source code;
   analyze the intermediate representation to determine one or more characteristics of the functionality, the one or more global variables of the high-level program, or both;
   determine one or more initialization parameters, one or more scope parameters, one or more implementation parameters, or any combination thereof, based upon the one or more characteristics of the functionality, the one or more global variables of the high-level program, or both;
   generate a hardware description layer (HDL) based upon the one or more initialization parameters, the one or more scope parameters, the one or more implementation parameters, or the any combination thereof; and
   implement, based on the generated HDL, the functionality on the integrated circuit.

2. The tangible, non-transitory, computer-readable medium of claim 1, wherein the instructions to determine the one or more initialization parameters, the one or more scope parameters, the one or more implementation parameters, or any combination thereof comprise instructions to:
   determine the one or more initialization parameters.

3. The tangible, non-transitory, computer-readable medium of claim 2, comprising instructions to determine the one or more initialization parameters at least in part by:
   determining if the functionality relies upon initialized values;
   if the functionality does not rely upon initialized values, generating the HDL without initialization; and
   if the functionality relies upon initialized values, generating the HDL with reset initialization logic, power-up initialization logic, or both.

4. The tangible, non-transitory, computer-readable medium of claim 3, comprising instructions to determine the one or more initialization parameters at least in part by:
   determining if the functionality relies upon initialized values on reset or power-up;
   if the functionality relies upon initialized values on reset, generating the HDL with the reset initialization logic; and
   if the functionality relies upon initialized values on power-up, generating the HDL with the power-up initialization logic, power-up initialization, or both.

5. The tangible, non-transitory, computer-readable medium of claim 4, wherein the reset initialization logic comprises a finite state machine that duplicates memory upon reset.

6. The tangible, non-transitory, computer-readable medium of claim 4, wherein the power-up initialization logic comprises a memory information file that specifies initial content of a memory block.

7. The tangible, non-transitory, computer-readable medium of claim 1, wherein the instructions to determine the one or more initialization parameters, the one or more scope parameters, the one or more implementation parameters, or any combination thereof comprise instructions to:
　determine the one or more scope parameters.

8. The tangible, non-transitory, computer-readable medium of claim 7, comprising instructions to determine the one or more scope parameters at least in part by:
　determining if data of the functionality is accessed external to the functionality;
　if the data is not accessed external to the functionality, implement storage of the data in one or more registers;
　if the data is accessed external to the functionality, implement the storage of the data:
　　internal to the functionality with a memory manager slave interface for external access; or
　　external to the functionality with a memory manager master interface for access by the functionality.

9. The tangible, non-transitory, computer-readable medium of claim 8, comprising instructions to:
　when the data is accessed external to the functionality, determine if the storage of the data is large;
　if the storage of the data is not large, implement the storage of the data internal to the functionality with a memory manager slave interface for external access; or
　otherwise, if the storage of the data is large, implement the storage of the data external to the functionality with a memory manager master interface for access by the functionality.

10. The tangible, non-transitory, computer-readable medium of claim 1, wherein the instructions to determine the one or more initialization parameters, the one or more scope parameters, the one or more implementation parameters, or any combination thereof comprise instructions to determine the one or more implementation parameters.

11. The tangible, non-transitory, computer-readable medium of claim 10, comprising instructions to:
　determine whether storage used to store data of the functionality is below a pre-defined threshold;
　if the storage is below the pre-defined threshold, implement the storage in one or more registers; or
　otherwise, determine if a specific access pattern is present for the storage.

12. The tangible, non-transitory, computer-readable medium of claim 11, comprising instructions to:
　if a left-shift access pattern or a right-shift access pattern is present, implement the storage in one or more shift registers;
　if a one-side-in and one-side-out access pattern is present, implement the storage in one or more FIFO buffers; and
　implement the storage in on chip memory as a fallback.

13. The tangible, non-transitory, computer-readable medium of claim 12, comprising instructions to:
　determine whether storage used to store data of the functionality is above a second pre-defined threshold;
　if the storage is not above the second pre-defined threshold, is above the pre-defined threshold, and no specific access pattern is present, implement the storage in the on chip memory; or
　otherwise, if the storage is above the second pre-defined threshold, implement the storage in off chip memory.

14. The tangible, non-transitory, computer-readable medium of claim 1, comprising instructions to:
　determine the one or more initialization parameters, the one or more scope parameters, and the one or more implementation parameters, based upon the one or more characteristics of the functionality, the one or more global variables of the high-level program, or both.

15. A system, comprising:
　a compiler configured to:
　　compile code from a high-level program into an intermediate representation comprising a data structure, intermediate code, or both, wherein the code is indicative of functionality of the high-level program and comprises one or more global variables of the high-level program;
　　analyze the intermediate representation to determine one or more characteristics of the functionality, the one or more global variables of the high-level program, or both;
　　determine one or more initialization parameters, one or more scope parameters, one or more implementation parameters, or any combination thereof, based upon the one or more characteristics of the functionality, the one or more global variables of the high-level program, or both; and
　　generate a hardware description layer (HDL) based upon the one or more initialization parameters, the one or more scope parameters, the one or more implementation parameters, or the any combination thereof; and
　an integrated circuit configured to:
　　receive the generated HDL from the compiler; and
　　implement, based at least in part on the generated HDL, a hardware implementation on the integrated circuit, wherein the hardware implementation is configured to implement the functionality.

16. The system of claim 15, wherein the hardware implementation comprises:
　a reset initialization logic that provides initial values to the hardware implementation upon reset, when the one or more initialization parameters indicate that the initial values should be provided on reset.

17. The system of claim 16, wherein the hardware implementation comprises:
　a power-up initialization logic that provides initialization values to the hardware implementation upon power-up, when the one or more initialization parameters indicate that the initial values should be provided upon power-up.

18. The system of claim 17, wherein:
　the reset initialization logic comprises a finite state machine that duplicates memory upon reset;
　the power-up initialization logic comprises a memory information file that specifies initial content of a memory block; or
　both.

19. A computer-implemented method, comprising:
　receiving, at a compiler, a high-level program comprising code indicative of functionality to be implemented on an integrated circuit (IC), wherein the code comprises one or more global variables of the high-level program;
　compiling, via the compiler, the code into an intermediate representation comprising a data structure, intermediate code, or both that is used internally by the compiler to represent high-level source code;
　analyzing, via the compiler, the intermediate representation to determine one or more characteristics of the functionality, the one or more global variables of the high-level program, or both;
　determining, via the compiler, one or more initialization parameters, one or more scope parameters, one or more implementation parameters, or any combination thereof, based upon the one or more characteristics of the functionality, the one or more global variables of the high-level program, or both;

generating, via the compiler, a hardware description layer (HDL) based upon the one or more initialization parameters, the one or more scope parameters, the one or more implementation parameters, or the any combination thereof;

receiving, from the compiler, the generated HDL at the integrated circuit; and implementing, based on the generated HDL, the functionality on the integrated circuit.

20. The computer-implemented method of claim 19, comprising:

performing a simulation analysis;

when expectations of the simulation analysis are not met:

providing an annotation understandable by the compiler to the compiler, the annotation comprising optimization guidance;

recompiling the code based upon the optimization guidance;

re-analyzing, via the compiler, the intermediate representation to determine one or more re-determined characteristics of the functionality, the one or more global variables of the high-level program, or both;

re-determining, via the compiler, the one or more initialization parameters, the one or more scope parameters, the one or more implementation parameters, or any combination thereof, based upon the one or more re-determined characteristics of the functionality, the one or more global variables of the high-level program, or both, resulting in one or more re-determined initialization parameters, one or more re-determined scope parameters, one or more re-determined implementation parameters, or any combination thereof; and re-generating, via the compiler, the hardware description layer (HDL) based upon the re-determined one or more initialization parameters, the re-determined one or more scope parameters, the re-determined one or more implementation parameters, or the any combination thereof.

* * * * *